US007884430B2

(12) United States Patent
Carter et al.

(10) Patent No.: US 7,884,430 B2
(45) Date of Patent: Feb. 8, 2011

(54) ISOLATED METAL PLUG PROCESS FOR USE IN FABRICATING CARBON NANOTUBE MEMORY CELLS

(75) Inventors: Richard J. Carter, Dresden (DE); Peter A. Burke, Portland, OR (US); Verne C. Hornback, Camas, WA (US); Thomas Rueckes, Rockport, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 12/710,477

(22) Filed: Feb. 23, 2010

(65) Prior Publication Data

US 2010/0148277 A1 Jun. 17, 2010

Related U.S. Application Data

(60) Division of application No. 11/429,069, filed on May 5, 2006, now Pat. No. 7,666,701, which is a continuation of application No. 11/077,898, filed on Mar. 11, 2005, now abandoned.

(51) Int. Cl.
*H01L 29/84* (2006.01)

(52) U.S. Cl. .............................. 257/415; 257/E29.324; 977/724; 977/943

(58) Field of Classification Search ......... 257/414–420, 257/E29.324; 438/50–53; 977/724, 732–733, 977/742, 943
See application file for complete search history.

(56) References Cited

U.S. PATENT DOCUMENTS

| | | | | |
|---|---|---|---|---|
| 6,955,937 | B1 * | 10/2005 | Burke et al. | 438/53 |
| 6,969,651 | B1 * | 11/2005 | Lu et al. | 438/257 |
| 6,990,009 | B2 * | 1/2006 | Bertin et al. | 365/151 |

* cited by examiner

*Primary Examiner*—Matthew W Such
(74) *Attorney, Agent, or Firm*—Wilmer Cutler Pickering Hale and Dorr LLP

(57) ABSTRACT

The present invention is directed to structures and methods of fabricating electromechanical memory cells having nanotube crossbar elements. Such memory cells include a substrate having transistor with a contact that electrically contacts with the transistor. A first support layer is formed over the substrate with an opening that defines a lower chamber above the electrical contact. A nanotube crossbar element is arranged to span the lower chamber. A second support layer is formed with an opening that defines a top chamber above the lower chamber, the top chamber including an extension region that extends beyond an edge of the lower chamber to expose a portion of the top surface of the first support layer. A roof layer covers the top of the top chamber and includes an aperture that exposes a portion of the extension region of the top chamber and includes a plug that extends into the aperture in the roof layer to seal the top and bottom chambers. The memory cell further includes an electrode that overlies the crossbar element such that electrical signals can activate the electrode to attract or repel the crossbar element to set a memory state for the transistor.

5 Claims, 6 Drawing Sheets

ISOLATED METAL PLUG PROCESS FOR USE IN FABRICATING CARBON NANOTUBE MEMORY CELLS

CROSS REFERENCE TO RELATED APPLICATIONS

This application is a divisional of and claims priority under 35 U.S.C. §121 to U.S. application Ser. No. 11/429,069, entitled "Isolated Metal Plug Process for use in Fabricating Carbon Nanotube Memory Cells," filed on May 5, 2006, which is a continuation of and claims priority under 35 U.S.C. §120 to U.S. application Ser. No. 11/077,898, entitled "Isolated Metal Plug Process For Use in Fabricating Carbon Nanotube Memory Cells," filed on Mar. 11, 2005.

FIELD OF THE INVENTION

The invention described herein relates generally to memory storage devices that use electromechanical elements in the individual memory cells. In particular, the present invention relates to methods, materials, and structures used in forming nanotube electromechanical elements for use in memory cells.

BACKGROUND OF THE INVENTION

Carbon nanotube technologies are beginning to make a significant impact on the electronic device industry. As is known to those having ordinary skill in the art, single-wall carbon nano-tubes are quasi one-dimensional nano-scale wires. Such tubes can demonstrate metallic or semiconducting properties depending on their chirality and radius. One new area of implementation is that of non-volatile memory devices. One such application is described in U.S. Pat. No. 6,574,130 which is directed to hybrid circuits using nanotube electromechanical memory. This reference is hereby incorporated by reference for all purposes. Such nanotube electromechanical memory devices are also described in detail in WO 01/03208 which is incorporated by reference in its entirety. A fuller description of the operation of these devices can be obtained in these references.

These hybrid memory devices make use of nanotubes operating as mechanical switches that can be switched on and off by electrodes. The nanotubes operate by having an air gap above and below the nanotubes. The electrodes are selectively biased to bend the nanotubes to make electrical contact (or not) with various electrical contacts of a memory cell in order to set a memory state for the memory cell. Thus, any partial filling of the air gaps impairs the operation of the memory cell. Current fabrication methods and structures are less effective than desired.

An example of a current method of constructing such a hybrid memory cell is described with respect to FIGS. 1(*a*)-1(*d*). Referring to FIG. 1(*a*), a substrate 101 has a transistor formed thereon. As depicted the transistor has diffusion regions 101*d* and a gate electrode 101*g*. Over the transistor is formed a dielectric layer 102 that typically includes electrical connects with the transistor and other circuit elements. For example a conductive via 103. Over this substrate is formed a first nitride layer 111 having a lower opening 112*a* that is filled with polysilicon sacrificial material. Over the sacrificial material is formed a nanotube electrical contact 113 that spans the lower opening 112*a*. This nanotube electrical contact 113 is electrically connected with other circuit elements. Over this substrate is formed an oxide layer 114 having an upper opening 112*b* that is filled with polysilicon sacrificial material. Thus, the upper sacrificial material is formed over the nanotube electrical contact 113. Typically, another nitride layer and an electrode 115 are formed over the upper sacrificial material 112*b* (and the underlying nanotube electrical contact 113).

Further processing requires that the sacrificial layers be removed and that the substrate be covered with a thick passivation layer. In current processes, this has proven a difficult problem to solve. The sacrificial layers must be removed first to create an air gap above and below the nanotube electrical contact. Referring to FIG. 1(*b*) a TMAH (tetramethyl ammonium hydroxide) wet etch is used to remove the sacrificial layers 112*a*, 112*b* underlying the electrode 115. This allows the formation of a lower air gap 122*a* and an upper air gap 122*b*. Thus, the nanotube electrical contact 113 now has underlying and overlying air gaps. This substrate must now be passivated. The problem is that the passivation materials have a tendency to fill the air gaps during passivation. This is detrimental to the operation of the device and therefore must be addressed.

FIGS. 1(*c*) and 1(*d*) refer to current solution to this passivation underfill problem. A thin "sealing" layer 123 of sputter deposited silicon dioxide ($SiO_2$) is used to form a layer that seals the air gap chambers. Subsequently, a thick layer of passivation material is used to form an interlayer dielectric layer (ILD layer). Although such a process can be used to fabricate air gaps, such a process is fraught with numerous process limitations and disadvantageous. For one, oxide sputtering processes do not easily integrate into the standard CMOS integration and process schemes used to fabricate the rest of the substrate. Additionally, and probably more importantly, the $SiO_2$ sputter deposition process used to seal the air gap chambers tends to fill the chambers to some extent. This chamber filling is contrary to the purpose of this step. Moreover, even partial filling of the air gap chambers puts a lower limit on the size of such chambers (i.e., the chambers must be of a certain size to accommodate the degree of filling caused by the $SiO_2$ sputtering.

Present processes for fabricating air gap chambers for use with nanotube structures present some problems which have not yet been successfully addressed in the industry. Accordingly, there is a need for process methods capable of reliable and repeatable fabrication of functional air gap chambers usable with nanotube crossbar structures such as memory cells and other structures for use in integrated circuits. Additionally, there is a need for new nano-scale electromechanical circuit structures and air gap chamber structures.

SUMMARY OF THE INVENTION

In accordance with the principles of the present invention disclose methods and structure comprising an improved air gap cell for use with a nanotube crossbar. In particular, the present invention is directed to an improved method of forming nanotube memory cells.

In one embodiment, the invention describes an electromechanical memory cell having nanotube crossbar elements. The memory cell includes a transistor overlaid with an insulative layer and an electrical contact that electrically contacts the transistor. A first support layer is formed over the substrate with an opening that defines a lower chamber above the electrical contact. A nanotube crossbar element is arranged to span the lower chamber. A second support layer is formed with an opening that defines a top chamber above the lower chamber, the top chamber including an extension region that extends beyond an edge of the lower chamber to expose a portion of the top surface of the first support layer. A roof layer covers the top of the top chamber and includes an aperture that exposes a portion of the extension region of the top chamber and includes a plug that extends into the aperture in the roof layer to seal the top and bottom chambers. The memory cell further includes an electrode that overlies the crossbar element such that electrical signals can activate the electrode to attract or repel the crossbar element to set a memory state for the transistor.

In another embodiment the invention describes a method of forming an electromechanical memory cell having nanotube crossbar elements. The method involves providing a semiconductor substrate having transistor formed thereon. The substrate including an electrical contact that electrically connects with the transistor. A first support layer is formed on the substrate with an opening over the electrical contact, the opening filled with a first sacrificial material. A crossbar element is formed over the first sacrificial material so that the crossbar element lies over the electrical contact wherein the crossbar element includes a nanotube or a nanotube ribbon. A second support layer is formed over the substrate so that it includes an opening above the opening in the first support layer. The opening in the second support layer defining a top chamber having an extension region that extends beyond an edge of the opening in the first support layer to expose a portion of the top surface of the first support layer. The top chamber is filled with a second sacrificial material and a roof layer is formed over the substrate with at least one aperture such that a portion of the top chamber is exposed in the extension region. The material of the first and second sacrificial layers are removed to form an open gap above and below the crossbar to form an open bottom chamber under the crossbar and an open top chamber above the crossbar. A plug layer is formed that seals the at least one aperture in the roof layer to seal the open top and bottom chambers. An electrode is formed over the crossbar element such that electrical signals provided to the electrode can activate the electrode to attract or repel the crossbar element to set a memory state for the transistor.

In another embodiment the invention describes a method of forming a chamber capable of supporting the operation of a nanotube crossbar cell. The method involves providing a semiconductor substrate with a first support layer having a top surface and an opening that defines a lower chamber filled with a first sacrificial layer. Forming a nanotube crossbar element over the first sacrificial layer. Forming a second support layer over the substrate with an opening formed above the lower chamber to define a top chamber that includes an extension region that extends beyond an edge of the lower chamber to expose a portion of the top surface of the first support layer. Forming a second sacrificial layer that fills the top chamber and forming a roof layer on the top of the substrate so that the roof layer has at least one aperture that exposes a portion of the extension region of the top chamber. Removing the sacrificial layers to form an open bottom chamber and an open top chamber. Forming a plug layer that blocks the at least one aperture in the roof layer to seal the open top and bottom chambers.

In one another embodiment a method of forming a nanotube crossbar cell is described. The method involves providing a semiconductor substrate having a first opening formed thereon that defines a lower chamber filled with a sacrificial material and having a crossbar element formed over the sacrificial material of the first opening, the crossbar element comprising one of a nanotube or a nanotube ribbon, the substrate further including a second opening above the lower chamber to define a top chamber filled with sacrificial material, the top chamber includes an extension region that extends beyond an edge of the lower chamber. Forming a roof layer on the top of the substrate so that the roof layer includes at least one aperture that exposes a portion of the sacrificial material of the extension region of the top chamber. Removing the sacrificial material from the top and bottom chambers to form an open bottom chamber below the crossbar and an open top chamber above the crossbar. Forming a plug layer that blocks the at least one aperture in the roof layer to seal the open top and bottom chambers.

These and other features and advantages of the present invention are described below with reference to the drawings.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various materials and method embodiments for constructing air gap chambers will be disclosed. In particular, air gap chambers for use with nanotube crossbar and electromechanical memory cells will be described.

Figure 1A:
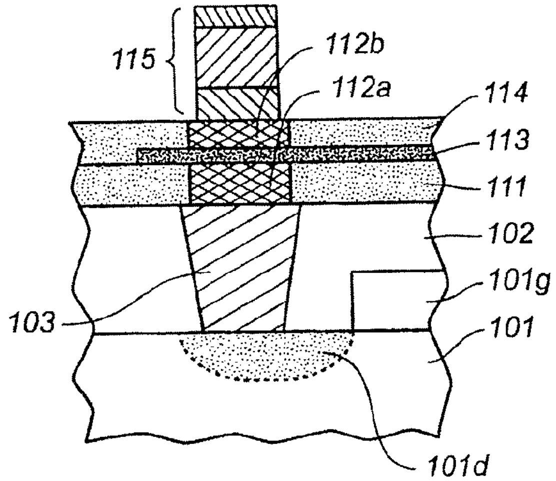
FIG. 1a (PRIOR ART)
FIGS. 1(*a*)-1(*d*) are simplified cross-section views of a semiconductor substrate that schematically illustrate a prior art air gap chamber fabrication method.
Figure 1B:
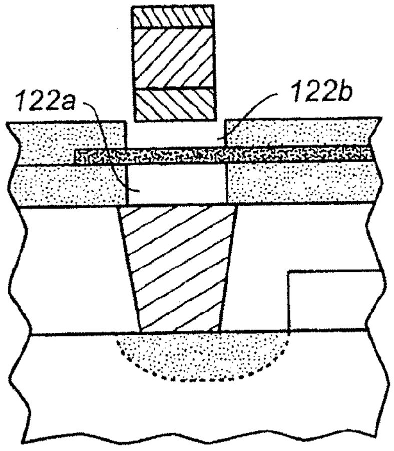
FIG. 1b (PRIOR ART)
Figure 1C:
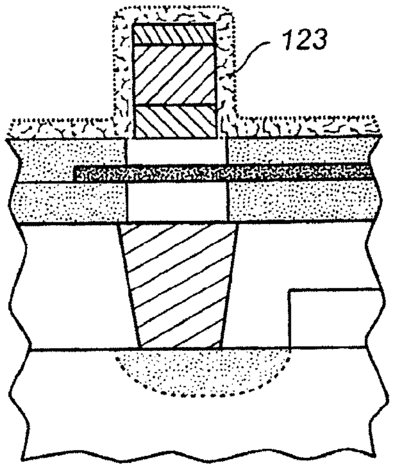
FIG. 1c (PRIOR ART)
Figure 1D:
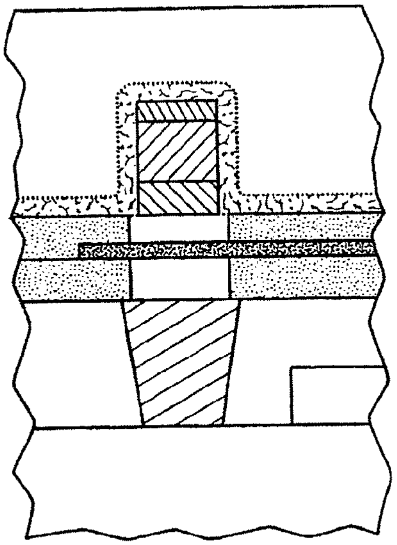
FIG. 1d (PRIOR ART)
Figure 2:
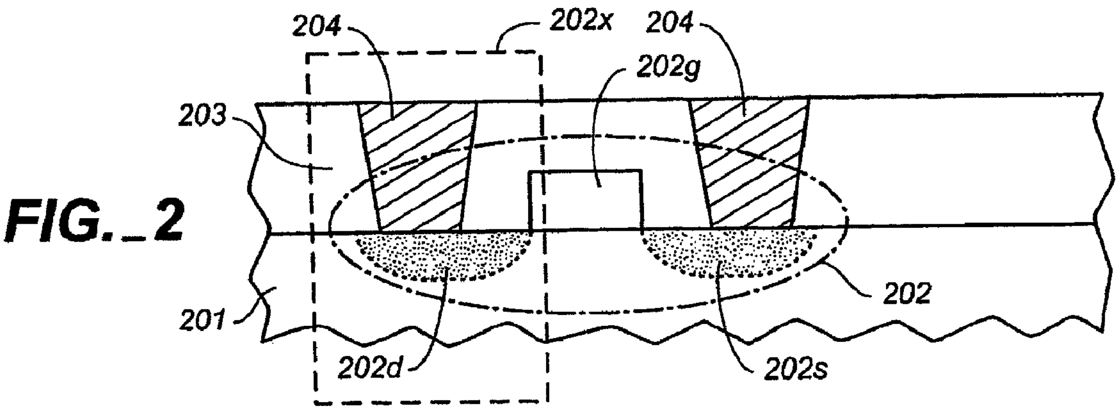
FIGS. 2-12 are simplified cross-section views of a semiconductor substrate that schematically illustrate a process flow for one embodiment of an air gap chamber fabrication methodology.

The inventors have invented, among other things, a superior method and structure for sealing air gap chambers in a CMOS fabrication process. FIG. 2 is a schematic depiction of a semiconductor substrate in readiness for processing in accordance with an embodiment of the invention. The schematic depiction is a crossection view of a semiconductor substrate. For example, a semiconductor wafer 201 has a transistor 202 formed thereon. The wafer can actually be any of a number of semiconductor substrates (Si, GaAs, etc.). The depicted transistor 202 includes a gate electrode 202*g* and, for example, a pair of diffusion regions 202*d*, 202*s*. Although the transistor 202 depicts a FET, the inventors contemplate other transistor types. The transistor is typically covered with a dielectric layer 203 (forming here an ILD). In the depicted embodiment, metal filled vias 204 electrically connect the diffusion regions 202*d*, 202*s*. Although not depicted here, other embodiments can use conducting vias to connect with the gate electrode 202*g*. Additionally, although no shown is this figure, other electrical connections can otherwise be formed throughout the depicted substrate.

Figure 3:
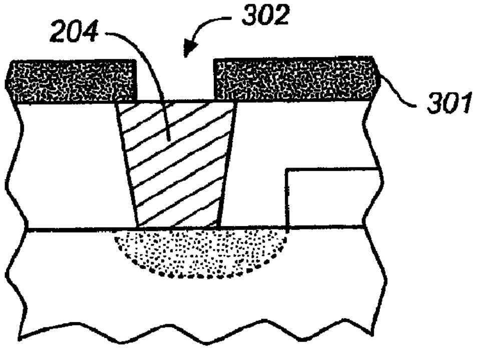

FIG. 3 is a cross section view of a portion of the substrate depicted in FIG. 2 (i.e., the portion defined by the dashed line region 202*x*). A first support layer 301 is deposited on the substrate. In many embodiments the first support layer 301 is an electrically insulating material. A few non-limiting examples of such insulating materials include silicon nitrides, silicon dioxide, silicon oxynitrides, as well as many other materials known to those having ordinary skill in the art. This first support layer 301 is formed to a thickness of in the range of about 10-40 nm (nanometers). In one embodiment, a layer of silicon nitride ($Si_3N_4$) about 20 nm thick can be used. Additionally, the first support layer 301 is formed with an opening 302 formed therein. Such an opening 302 can be formed by first depositing the first support layer 301 then selectively etching away a portion of the layer 301. Such etching can be achieved using many etching techniques, for example, a plasma dry etch. Alternatively, the first support layer 301 can be formed by selectively depositing the material comprising the first support layer 301 such that the opening is formed. The opening 302 overlies the via 204 and defines the lower air gap chamber. The opening 302 is generally about 100-300 nm wide. In some embodiments an opening of about 180-250 nm is used.

Figure 4:
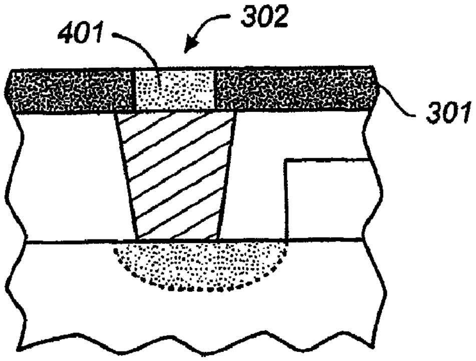

FIG. 4 is a cross section view of the substrate depicted in FIG. 3. The opening 302 in the first support layer 301 has been filled with a sacrificial material 401. The sacrificial material is chosen for its relative ease of etching and more importantly its etch selectivity relative to the material of the first support layer 301. For example, where, as here, the first support layer 301 is a nitride material polysilicon makes a good sacrificial material. Also, for example, aluminum can be used. Many other materials are possible. Once the sacrificial layer is formed it is planarized until it is removed from the first support layer 301 and remains in the opening 302. Such a process is akin to a CMP step used in damascene processes. Thus, like the first support layer 301 the sacrificial layer 401 is formed to a thickness of in the range of about 10-40 nm.

Figure 5:
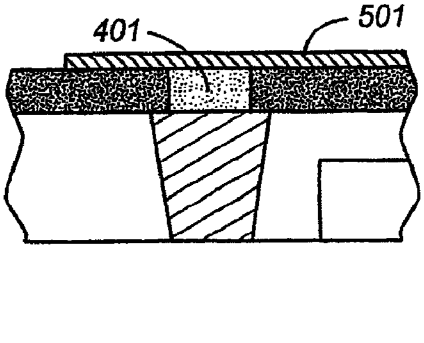

Subsequently, a nanotube crossbar 501 is formed over the sacrificial layer 401. This is schematically depicted in FIG. 5 (in which only a portin of the nanotube structure is depicted). In some embodiments this crossbar 501 can be formed as one or more nanotubes. Alternatively, the crossbar 501 can be formed from nanotube ribbon structures. Such ribbons and the methods of their construction are disclosed, for example, in the previously incorporated patent documents U.S. Pat. No. 6,574,130 or WO 01/03208. In one embodiment, a layer of nanotube material is spin coated onto the substrate and then patterned (i.e., using photoresist) and selectively etched to form the desired shape and size nanotube ribbon crossbar 501. The crossbar spans the opening 302 and is generally about 100-300 nm wide. Typically, the length of the crossbar is in the range of 8-15 times as long as the opening 302 is deep. The inventors point out that the invention can use carbon nanotubes as well as doped carbon nanontubes. Additionally, this disclosure is intended to cover nanotubes formed from other materials.

Figure 6:
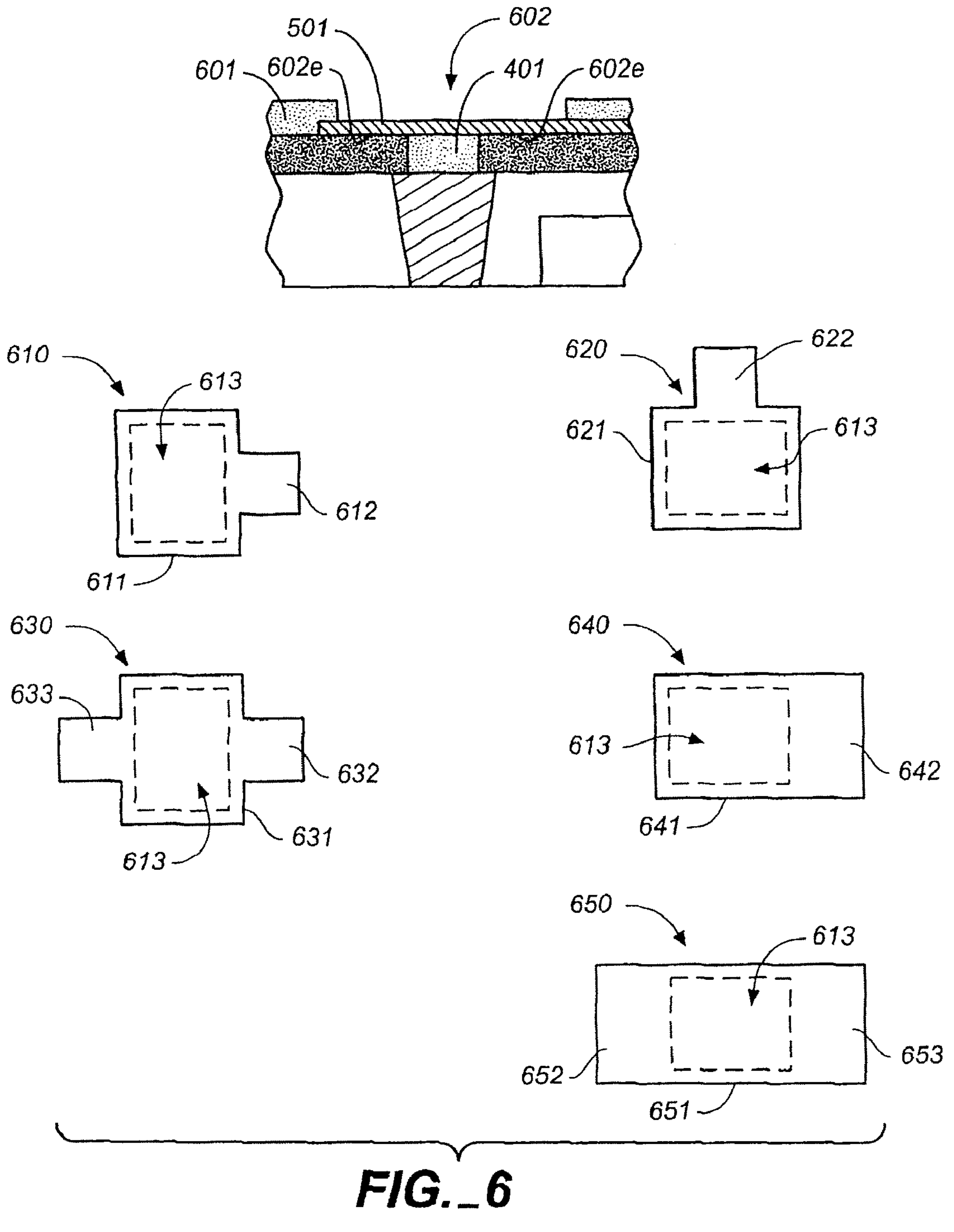

FIG. 6 is a cross section view of a portion of the substrate depicted in FIG. 5. This operation is used to generate a second upper opening. Importantly, this second opening has extension regions that do not overlap the first opening. The importance of these extension regions and their purpose in a fabrication process flow will be described presently. A second support layer 601 is deposited on the substrate. As with the first support layer 301, in many embodiments the second support layer 601 can be an electrically insulating material. A few non-limiting examples of such insulating materials include silicon nitrides, silicon dioxide, silicon oxynitrides, as well as many other materials known to those having ordinary skill in the art. Additionally, the second support layer 601 can be formed of metals or metal alloy including, but not limited to materials like titanium (Ti), tantalum (Ta), titanium nitride (TiN), tantalum nitride (TaN), and so on. Many such suitable materials are known to those having ordinary skill in the art. This second support layer 301 is formed to a thickness of in the range of about 10-40 nm (nanometers). In one embodiment, a layer of silicon dioxide about 20 nm thick can be used. The second support layer 601 is formed with an opening 602 formed therein. As before, the opening 602 can be formed by first depositing the second support layer 601 then selectively etching away a portion of the layer 601. Such etching can be achieved using many etching techniques, for example, a wet etch can be used. Alternatively, the second support layer 601 can be formed by selectively depositing the material comprising the second support layer 601 such that the opening is formed.

The opening 602 overlies the crossbar 501 and defines the upper air gap chamber. Importantly, the opening 602 includes one or more extension regions 602*e* that extend beyond the edge of the first opening 401. Thus, a top surface of the first support layer is exposed in the extension region 602*e*. FIG. 6 also schematically depicts a number of embodiments of various extension regions. The depicted embodiments are depicted in a top down view. 610 depicts an embodiment where the upper opening 611 includes an extension region comprising an extension tab 612 that extends beyond the lower opening 613 (the dashed lines) to expose a portion of the underlying first support layer. 620 depicts another embodiment where the upper opening 621 includes an extension region comprising an extension tab 622 that extends beyond the lower opening 613 to expose a portion of the underlying first support layer. In another alternative, 630 depicts an embodiment where the upper opening 631 includes the extension region comprises a pair of extension tabs 632, 633 that extends beyond the lower opening 613 to expose portions of the underlying first support layer. 640 depicts yet another embodiment where the upper opening 641 includes an extension region 642 that is larger than a tab and can comprise an entire side (or any portion thereof) of the opening 641 extending beyond the lower opening 613 to expose a portion of the underlying first support layer. In another alternative, 650 depicts an embodiment where the upper opening 651 includes an extension region comprising a pair of extension regions 652, 653 that can extend along an entire side (or any, portion thereof) of the opening 651 extending beyond the lower opening 613 to expose portions of the underlying first support layer. Various other combinations of tabs and extension regions are contemplated by the inventors. In general, the idea of such extension regions is to expose a portion of the top surface of the first support layer accordingly the exposed portion does not overlay the lower chamber. This is important for reasons that are explained later in this patent.

Figure 7:
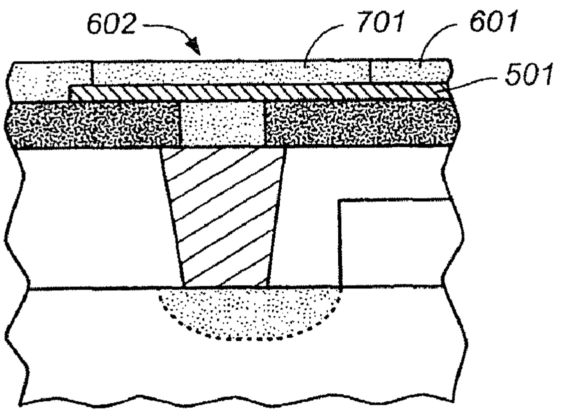

FIG. 7 is a cross section view of the substrate depicted in FIG. 6. The opening 602 in the second support layer 601 has been filled with another sacrificial material 701. Again, the sacrificial material is chosen for its relative ease of etching and its etch selectivity relative to the second support layer 601. Typically, where the second support layer 601 is a oxide material, polysilicon makes a good sacrificial material. Polysilicon also works well as a sacrificial layer 701 where the second support layer 601 comprises a silicon nitride material. Also, for example, aluminum can be used. Many other materials are possible, the idea being to provide a material that is relatively easy to etch and that has good etch selectivity relative to the first and second support layers. Once the sacrificial layer is formed, it is planarized until it reaches the second support layer 601 and a substantially planar fill remains in the opening 602. Such a process is akin to a CMP step used in damascene processes. Thus, like the second support layer 601 the sacrificial layer 701 is formed to a thickness of in the range of about 10-40 nm. The two layers of sacrificial materials can be formed of two different sacrificial materials. Although it is preferred that the two sacrificial layers are formed of the same material. For example, as depicted here with nitride and silicon dioxide support layers polysilicon sacrificial material is very suitable.

Figure 8:
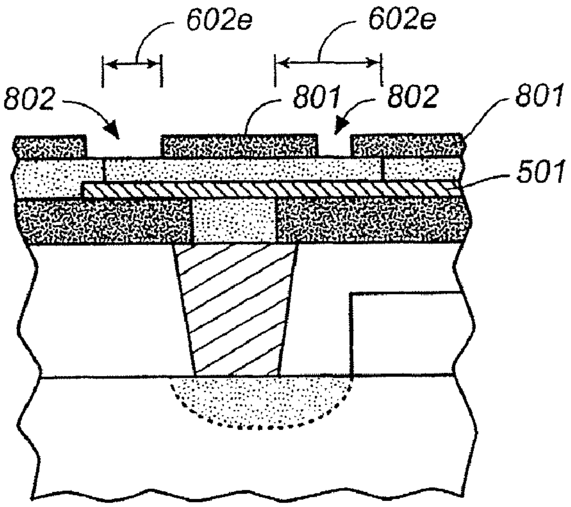

As shown in FIG. 8, a thin roof layer is formed. This roof layer 801 defines the top of an upper air gap chamber used with the nanotube cross bar 501. The roof layer 801 is commonly formed of a nitride material, however, in other embodiments other electrically insulating materials can be used. In the depicted example, the layer 801 comprises silicon nitride material. Such a material is preferred because the nanotube crossbar 501 does not readily adhere to such material during operation. Importantly, the roof layer 801 includes openings 802 that overlie in the extension region 602*e*. These openings form etch access apertures that facilitate the removal of the sacrificial material. Also, the openings 802 do not overlie the lower opening in the first support layer. Typically, the nitride layer is quite thin, being on the order of about 10-40 nm thick. The openings 802 are commonly about 50-200 nm across. Other dimensions are of course possible and are adjusted to meet the particular needs of the specific structures fabricated. In the depicted embodiment, for example, the openings 802 are about 100 nm across.

Figure 9A:
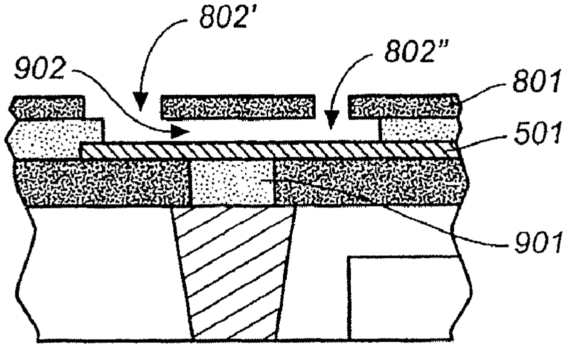
Figure 9B:
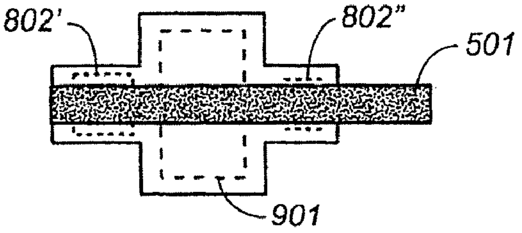

Referring now to FIG. 9(*a*), which is a schematic cross section view of the substrate after further processing. Once the roof layer 801 is formed, the sacrificial material is removed to form a lower chamber 901 below the crossbar 501 and an upper chamber 902 above the crossbar. These chambers define the upper and lower air gaps used to allow movement of the crossbar 501. Where the sacrificial material is, for example, polysilicon, it can be removed using, for example, a TMAH wet etch. In one implementation, a 2% TMAH solution in water can be used at 70° C. for 30 minutes to remove the sacrificial material using a standard wet etch bench. As an alternative, a non-plasma etch using, for example, gaseous $XeF_2$ can be employed to remove the sacrificial material. Of course different sacrificial material and support layer material combinations will require different etchants and etch conditions. The sacrificial layer removal process can be adjusted accordingly.

FIG. 9(*b*) is a top down view of FIG. 9(*a*) with some portions cut away for enhanced clarity. The openings 802', 802" (both depicted in dashed line) in the roof layer 801 are depicted. A portion of the crossbar 501 is depicted. Here the crossbar 501 is depicted as a nanotube ribbon which spans the lower chamber 901 (depicted in dashed line).

Figure 10:
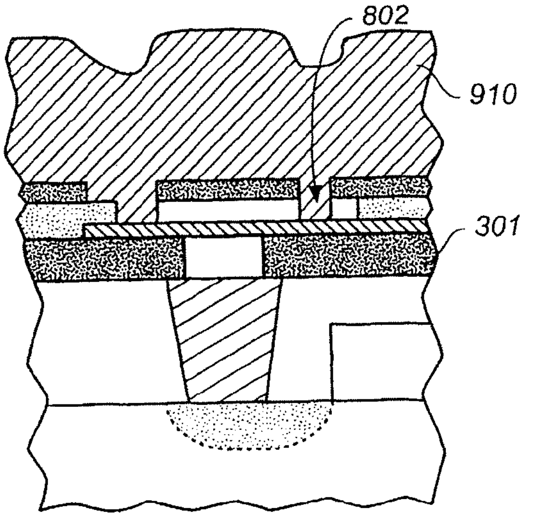

As depicted in FIG. 10, a thick layer of electrode material is deposited to form a conductive layer 910. Typical conductive materials include but are not limited to, Ta, Ti, W, TaN, TiN, and others. Typically such a conductive layer 910 is formed to a thickness of about 1500 Å (+/− about 500 Å). In one implementation a sputter deposition technique can be used to form the conductive layer 910. Alternatively, other directionally oriented deposition techniques can be used. Importantly, the material used to form the conductive layer 910 blocks the openings 802. Typically, due to the directional nature of the deposition process, the conductive layer 910 penetrates down to the exposed top surface of the first support layer.

Figure 11:
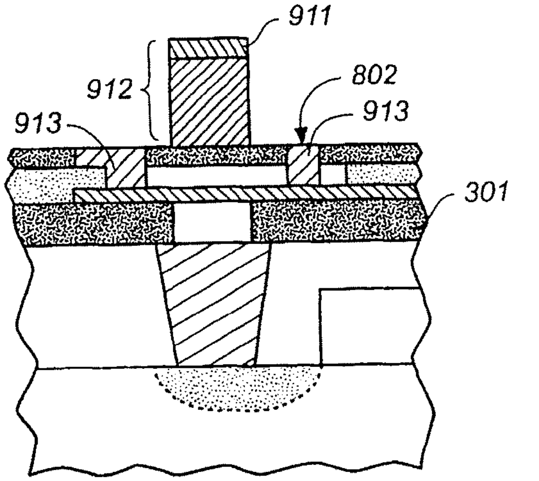

Typically, the conductive layer 910 is planarized to a desired thickness (commonly using a CMP process). The layer 910 is then formed into an electrode. In one example, the conductive layer 910 is patterned and the bulk of conductive layer 910 is etched away to leave an electrode 912 as depicted in FIG. 11. Also, the conductive layer 910 remains largely in place as pillars 913 that rest on the top of the first support layer 301 and block the openings 802 thereby sealing the air gaps formed by the lower chamber 901 and upper chamber 902. Commonly, a hard mask (e.g., $SiO_2$) is used to pattern the conductive layer 910. This mask can be removed or left in place (i.e., as layer 911) as desired by the user. Moreover, other mask materials can be employed.

Figure 12:
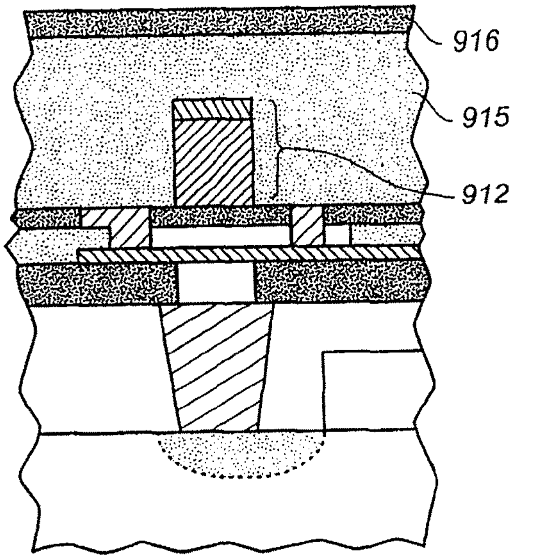

As shown in FIG. 12, the substrate is then passivated using a dielectric layer 915. Commonly such a layer 915 is formed of a low-K dielectric material as is known to those having ordinary skill in the art. This passivation is typically quite thick being on the order of 3000 Å thick and greater. Alternatively, other electrically insulating materials can be employed. Additionally, more than one passivation layer can be used. For example, a relatively thin layer of $SiO_2$ can be formed followed by a thicker layer of low-K material. Finally, if desired a further insulating layer 916 can be formed over the layer 915. Layer 916 can be formed for example from nitride materials. This substrate can have further materials formed thereon. As is known to those having ordinary skill in the art and in the literature the electrode 912 can be selectively biased and unbiased to flex the crossbar to set the memory state of the memory cell, for example, by contacting the crossbar with the underlying via layer 915.

Figure 13:
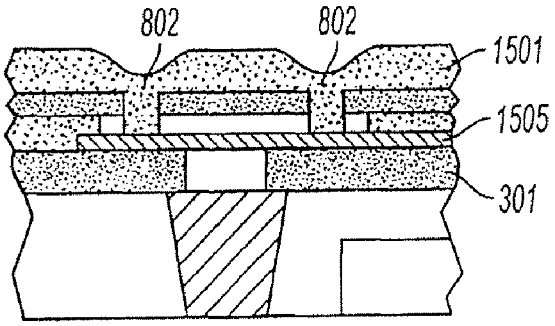
FIGS. 13-14 are simplified cross-section views of a semiconductor substrate that schematically illustrate a process flow for another embodiment used to form an electrode in a layer of insulating material in order to fabricate a memory cell in accordance with the principles of the invention.

FIG. 13 schematically depicts processes performed on the substrate of FIG. 9. A thick layer of electrically insulating material is deposited to form a non-conductive layer 1501. The list of such materials is quite extensive and is well known to those of ordinary skill. In one example $SiO_2$ can be used. This layer can be formed using a standard PVD process. Typically this non-conductive layer 1501 is formed to a thickness of about 1500 Å (+/− about 500 Å). As with the previous embodiments, the material used to form the layer 1501 blocks the openings 802. Typically, due to the directional nature of the deposition process, the deposited layer 1501 penetrates down to the exposed top surface of the first support layer 301. Thus, the non-conductive layer 1501 includes pillars 1505 that rest on the top of the first support layer 301 and block the openings 802 thereby sealing the air gaps formed by the lower chamber 901 and upper chamber 902.

Figure 14:
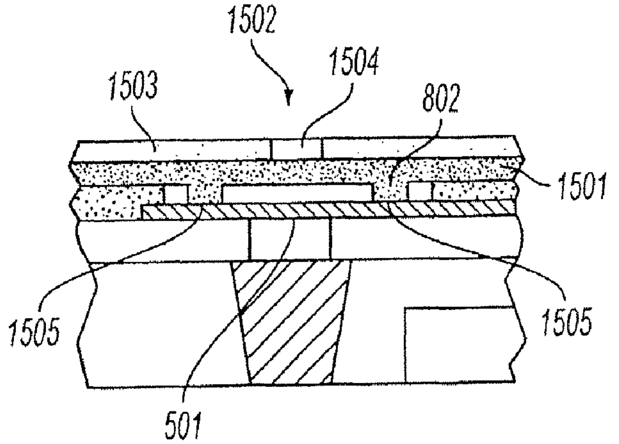

As depicted in FIG. 14, layer 1501 is etched above the crossbar 501 to form an opening 1502 in the layer 1501. A thin layer 1503 of non-conductive material is typically left on the bottom of the opening 1502. The opening 1502 defines a space for the deposition of the electrode. A layer of conductive material is formed over the entire substrate. Such conductive materials include, but are not limited to, tungsten, tantalum, titanium, and so on. Also, conductive metal alloys may also be used. The layer of conductive material is then planarized back until the layer 1501 of non-conductive material is reached thereby defining an inlaid electrode 1504. Passivation layers can then be formed much in the same manner as described with respect to the discussions of FIG. 12 hereinabove.

Figure 15:
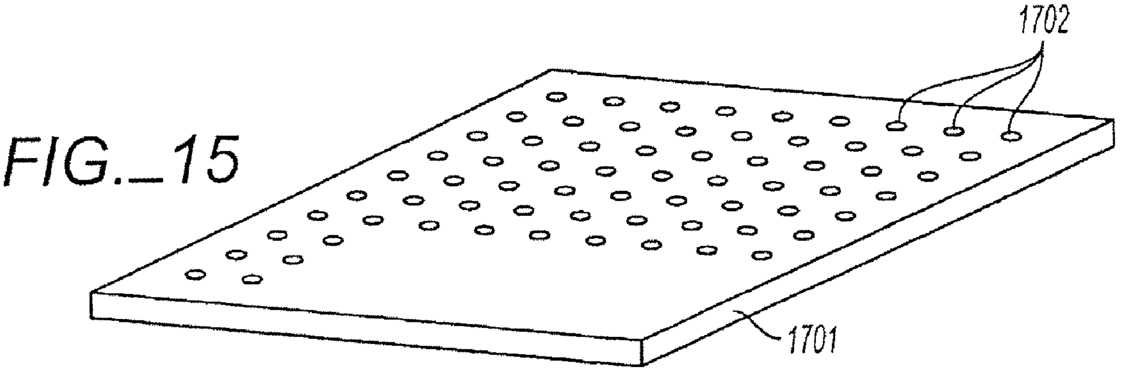
FIG. 15 is a simplified depiction of a semiconductor IC substrate having an array of memory cell schematically depicted thereon in accordance with the principles of the invention.

Commonly such structures as described herein are implemented in the electromechanical memory cells of an integrated circuit that typically includes a plurality of electromechanical memory cells. These electromechanical memory cells 1702 are schematically depicted in FIG. 15 which depicts an IC chip 1701 having an array of electromechanical memory cells 1702 formed thereon.

The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. An electromechanical memory cell having nanotube crossbar elements, the memory cell comprising:

a semiconductor substrate having transistor formed thereon with an insulative layer formed over the transistor and an electrical contact that extends through the insulative layer to electrically contact the transistor;

a first support layer formed over the substrate with a top surface and an opening that defines a bottom chamber above the electrical contact;

a crossbar element that spans the lower chamber wherein the crossbar element includes a nanotube or a nanotube ribbon;

a second support layer formed over the substrate with an opening that defines a top chamber above the bottom chamber, the top chamber including an extension region that extends beyond an edge of the lower chamber to expose a portion of the top surface of the first support layer;

a roof layer that covers the top of the top chamber and includes an one aperture that exposes a portion of the extension region of the top chamber;

a conductive plug that extends into the aperture in the roof layer to seal the top and bottom chambers; and an electrode that overlies the crossbar element such that electrical signals can activate the electrode to attract or repel the crossbar element to set a memory state for the transistor.

2. The electromechanical memory cell of claim 1 wherein the electrode does not lie over the plug in the roof layer.

3. The electromechanical memory cell of claim 1 wherein the plug is comprised of electrically conductive material.

4. The electromechanical memory cell of claim 1 wherein the plug is comprised of electrically insulating material.

5. An integrated circuit including plurality of electromechanical memory cells of claim 1.

* * * * *